(12) United States Patent
Fery et al.

(10) Patent No.: US 7,256,491 B2
(45) Date of Patent: Aug. 14, 2007

(54) THERMAL INTERCONNECT SYSTEMS METHODS OF PRODUCTION AND USES THEREOF

(75) Inventors: Mark Fery, Spokane, WA (US); Nancy Dean, Ann Arbor, MI (US)

(73) Assignee: Honeywell International Inc., Morris Township, NJ (US)

( * ) Notice: Subject to any disclaimer, the term of this patent is extended or adjusted under 35 U.S.C. 154(b) by 0 days.

(21) Appl. No.: 10/538,821

(22) PCT Filed: Jun. 4, 2004

(86) PCT No.: PCT/US2004/017906

§ 371 (c)(1),
(2), (4) Date: Feb. 22, 2006

(87) PCT Pub. No.: WO2004/109795

PCT Pub. Date: Dec. 16, 2004

(65) Prior Publication Data

US 2006/0151873 A1    Jul. 13, 2006

Related U.S. Application Data

(60) Provisional application No. 60/476,768, filed on Jun. 6, 2003.

(51) Int. Cl.
*H01L 23/10* (2006.01)
*H01L 21/00* (2006.01)

(52) U.S. Cl. .................. 257/706; 257/707; 257/709; 257/711; 257/712; 257/713; 257/717; 257/718; 257/720; 257/722; 257/E33.075; 438/122

(58) Field of Classification Search ............... 257/706, 257/708, 709, 722, 712–720
See application file for complete search history.

(56) References Cited

U.S. PATENT DOCUMENTS

| | | | |
|---|---|---|---|
| 2,439,935 A | 4/1948 | Jones et al. ................ 204/45 |
| 5,223,741 A | 6/1993 | Bechtel et al. ............. 257/678 |
| 5,635,764 A | 6/1997 | Fujikawa et al. ........... 257/766 |
| 5,777,385 A * | 7/1998 | Wu ............................ 257/712 |
| 5,886,403 A * | 3/1999 | Yoshinaga et al. ......... 257/688 |
| 5,981,085 A | 11/1999 | Ninomiya et al. ......... 428/614 |
| 6,274,407 B1 | 8/2001 | Baker et al. ................ 438/111 |
| 6,317,326 B1 * | 11/2001 | Vogel et al. ................ 361/704 |
| 6,504,242 B1 | 1/2003 | Deppisch et al. .......... 257/707 |
| 6,617,683 B2 * | 9/2003 | Lebonheur et al. ........ 257/707 |
| 2002/0175403 A1 | 11/2002 | Sreeram et al. ............ 257/702 |
| 2003/0047814 A1 | 3/2003 | Kwon ........................ 257/778 |

FOREIGN PATENT DOCUMENTS

JP    2000-294699    * 10/2000

OTHER PUBLICATIONS

PCT International Search Report dated Dec. 12, 2004.
PCT Written Opinion dated Dec. 12, 2004.

* cited by examiner

*Primary Examiner*—Jasmine Clark
(74) *Attorney, Agent, or Firm*—Sandra P. Thompson; Buchalter Nemer

(57) ABSTRACT

A thermal transfer material is described herein that includes: a heat spreader component, wherein the heat spreader component comprises a top surface, a bottom surface and at least one heat spreader material, and at least one solder material, wherein the solder material is directly deposited onto the bottom surface of the heat spreader component. Methods of forming layered thermal interface materials and thermal transfer materials include: a) providing a heat spreader component, wherein the heat spreader component comprises a top surface, a bottom surface and at least one heat spreader material; b) providing at least one solder material, wherein the solder material is directly deposited onto the bottom surface of the heat spreader component; and c) depositing the at least one solder material onto the bottom surface of the heat spreader component.

34 Claims, No Drawings

THERMAL INTERCONNECT SYSTEMS METHODS OF PRODUCTION AND USES THEREOF

This application claims priority to U.S. Provisional Application Ser. No. 60/476,768 filed on Jun. 6, 2003, which is commonly-owned by Honeywell International Inc. and included herein in its entirety by reference.

FIELD OF THE INVENTION

The field of the invention is thermal interconnect systems in electronic components, semiconductor components and other related layered materials applications.

BACKGROUND

Electronic components are used in ever increasing numbers of consumer and commercial electronic products. Examples of some of these consumer and commercial products are televisions, personal computers, Internet servers, cell phones, pagers, palm-type organizers, portable radios, car stereos, or remote controls. As the demand for these consumer and commercial electronics increases, there is also a demand for those same products to become smaller, more functional, more cost efficient and thermally efficient, and more portable for consumers and businesses.

As a result of the size decrease in these products, the components that comprise the products must also become smaller, better manufactured and better designed. Examples of some of those components that need to be reduced in size or scaled down are printed circuit or wiring boards, resistors, wiring, keyboards, touch pads, and chip packaging.

Components, therefore, are being broken down and investigated to determine if there are better building materials and methods that will allow them to be scaled down and/or combined to accommodate the demands for smaller electronic components. In layered components, one goal appears to be decreasing the number of the layers while at the same time increasing the functionality and durability of the remaining layers, decreasing the production steps and increasing the cost efficiency. These tasks can be difficult, however, given that the number of layers cannot readily be reduced without sacrificing functionality.

Also, as electronic devices become smaller and operate at higher speeds, energy emitted in the form of heat increases dramatically. A popular practice in the industry is to use thermal grease, or grease-like materials, alone or on a carrier in such devices to transfer the excess heat dissipated across physical interfaces. The most common types of thermal interface materials are thermal greases, phase change materials, and elastomer tapes. Thermal greases or phase change materials have lower thermal resistance than elastomer tape because of the ability to be spread in very thin layers and provide intimate contact between adjacent surfaces. Typical thermal impedance values range between 0.1-1.6° C. cm$^2$/W. However, a serious drawback of thermal grease is that thermal performance deteriorates significantly after thermal cycling, such as from 65° C. to 150° C., or after power cycling when used in VLSI chips. It has also been found that the performance of these materials deteriorates when large deviations from surface planarity causes gaps to form between the mating surfaces in the electronic devices, or when large gaps between mating surfaces are present for other reasons, such as manufacturing tolerances, etc. When the heat transferability of these materials breaks down, the performance of the electronic device in which they are used is adversely affected.

Organic pastes and epoxies are also being used to facilitate heat removal from the component. One example of this use is applying the organic paste and/or epoxy to the interface between the silicon and a heat spreader, such as a nickel plated copper spreader. These pastes and epoxies are normally filled with metal or other thermally conductive particles to improve heat transfer. As components are becoming smaller and more complex, the amount of heat to be removed has increased to the point where solid metal thermal interface is necessary. In most conventional applications, the solid metal thermal interface is a solder material of melting point 140-200° C.

As more solder materials are being utilized in components to dissipate heat, it has been discovered that it is difficult to solder to nickel without the use of a material, such as a flux, because of the production of detrimental nickel oxides at the solder-nickel interface. One recent approach to completing the solder joint without the use of a flux is to electrodeposit a gold spot on the precise location where the solder joint is to be formed. This approach is described in U.S. Pat. No. 6,504,242 issued to Deppisch et al. (Jan. 7, 2003). While this approach works well functionally, the value of gold contained within the spot is detrimental to the cost efficiency of the components. Furthermore, in order to complete a joint having a gold spot or gold interface, there are at least two process steps necessary—deposition of the gold and application of the solder material. These additional process steps are not only costly, but slow.

Thus, there is a continuing need to: a) design and produce thermal interconnects and thermal interface materials, layered materials, components and products that meet customer specifications while minimizing the size of the device and number of layers; b) produce more efficient and better designed materials, products and/or components with respect to the compatibility requirements of the material, component or finished product; c) develop reliable methods of producing desired thermal interconnect materials, thermal interface materials and layered materials and components/products comprising contemplated thermal interface and layered materials; d) develop materials that possess a high thermal conductivity and a high mechanical compliance; and e) effectively reduce the number of production steps necessary for a package assembly, which in turn results in a lower cost of ownership over other conventional layered materials and processes.

SUMMARY OF THE SUBJECT MATTER

A thermal transfer material is described herein that includes: a heat spreader component, wherein the heat spreader component comprises a top surface, a bottom surface and at least one heat spreader material, and at least one solder material, wherein the solder material is directly deposited onto the bottom surface of the heat spreader component.

Methods of forming layered thermal interface materials and thermal transfer materials include: a) providing a heat spreader component, wherein the heat spreader component comprises a top surface, a bottom surface and at least one heat spreader material; b) providing at least one solder material, wherein the solder material is directly deposited onto the bottom surface of the heat spreader component; and c) depositing the at least one solder material onto the bottom surface of the heat spreader component.

DETAILED DESCRIPTION

A suitable interface material or component should conform to the mating surfaces ("wets" the surface), possess a low bulk thermal resistance and possess a low contact resistance. Bulk thermal resistance can be expressed as a function of the material's or component's thickness, thermal conductivity and area. Contact resistance is a measure of how well a material or component is able to make contact with a mating surface, layer or substrate. The thermal resistance of an interface material or component can be shown as follows:

$$\Theta_{interface} = t/kA + 2\Theta_{contact} \qquad \text{Equation 1}$$

where $\Theta$ is the thermal resistance,
t is the material thickness,
k is the thermal conductivity of the material
A is the area of the interface The term "t/kA" represents the thermal resistance of the bulk material and "$2\Theta_{contact}$" represents the thermal contact resistance at the two surfaces. A suitable interface material or component should have a low bulk resistance and a low contact resistance, i.e. at the mating surface.

Many electronic and semiconductor applications require that the interface material or component accommodate deviations from surface flatness resulting from manufacturing and/or warpage of components because of coefficient of thermal expansion (CTE) mismatches. A material with a low value for k, such as thermal grease, performs well if the interface is thin, i.e. the "t" value is low. If the interface thickness increases by as little as 0.002 inches, the thermal performance can drop dramatically. Also, for such applications, differences in CTE between the mating components causes the gap to expand and contract with each temperature or power cycle. This variation of the interface thickness can cause pumping of fluid interface materials (such as grease) away from the interface.

Interfaces with a larger area are more prone to deviations from surface planarity as manufactured. To optimize thermal performance, the interface material should be able to conform to non-planar surfaces and thereby lower contact resistance. Optimal interface materials and interconnect materials and/or components possess a high thermal conductivity and a high mechanical compliance, e.g. will yield elastically when force is applied. High thermal conductivity reduces the first term of Equation 1 while high mechanical compliance reduces the second term.

As mentioned earlier, several goals of layered interface materials and individual components described herein are to: a) design and produce thermal interconnects and thermal interface materials, layered materials, components and products that meet customer specifications while minimizing the size of the device and number of layers; b) produce more efficient and better designed materials, products and/or components with respect to the compatibility requirements of the material, component or finished product; c) develop reliable methods of producing desired thermal interconnect materials, thermal interface materials and layered materials and components/products comprising contemplated thermal interface and layered materials; d) develop materials that possess a high thermal conductivity and a high mechanical compliance; and e) effectively reduce the number of production steps necessary for a package assembly, which in turn results in a lower cost of ownership over other conventional layered materials and processes.

The layered interface materials and the individual components of the layered interface materials described herein accomplish these goals. When properly produced, the heat spreader component described herein will span the distance between the mating surfaces of the thermal interface material and the heat spreader component, thereby allowing a continuous high conductivity path from one surface to the other surface.

Components and materials, including thermal transfer materials, contemplated herein comprise a heat spreader component and a solder material. The heat spreader component comprises a top surface, a bottom surface and at least one heat spreader material. The solder material is directly deposited onto the bottom surface of the heat spreader component. These components and materials are generally produced by methods that eliminate the use and cost of materials, such as gold, and eliminate the extra process step of dispensing the solder during assembly that are present in conventional processes. The deposition of the solder material on the bottom surface of the heat spreader component eliminates the need to effectively deal with oxides that may form on the top surface of the heat spreader component before application of the solder. In addition, the solder material can be tailored so that it has improved adherence to the substrate surface either by improved wetting properties or by formation of low temperature silicides and/or bonds between the solder and the substrate.

In contemplated embodiments, the solder material is directly deposited onto the bottom side of the heat spreader component. In some contemplated embodiments, the solder material is deposited by electrodeposition. In other contemplated embodiments, the solder material is silk screened or dispensed directly onto the heat spreader. In yet other contemplated embodiments, a film of solder is deposited and combined with other methods of building adequate solder thickness, including direct attachment of a preform or silk screening of a solder paste.

Another method of laying down layers or ultrathin layers is the pulse periodic reverse method or PPR. The pulse periodic reverse method goes one step beyond the pulse plating method by actually "reversing" or depleting the film at the cathode surface. A typical cycle for pulse periodic reverse might be 10 ms at 5 amps cathodic followed by 0.5 ms at 10 amps anodic followed by a 2 ms off time. There are several advantages of PPR. First, by "stripping" or deplating a small amount of film during each cycle, PPR forces new nucleation sites for each successive cycle resulting in further reductions in porosity. Second, cycles can be tailored to provide very uniform films by selectively stripping the thick film areas during the "deplating" or anodic portion of the cycle. Pulse plating and pulse periodic reverse systems can be purchased from any suitable source, such as a company like Dynatronix (www.dynatronix.com), or built (in whole or in part) on site. These deposition methods are described in U.S. Provisional Patent Application Ser. No. 60/448,722 filed on Feb. 19, 2003, which is commonly owned by Honeywell International Inc. and is incorporated herein in its entirety.

These layers can also be laid down by any method capable of producing a uniform layer with a minimum of pores, preferably with a relatively high deposition rate. Many suitable methods and apparatus are available to lay down layers or ultra thin layers of this type, however, one of the best apparatus and methods of achieving a high quality layer of material is electrodeposition and/or related techniques, such as pulsed plating or direct current plating, where are described herein. Pulsed plating (which is intermittent plating as opposed to direct current plating) can lay down layers that are free or virtually free of pores and/or voids and is normally preferred for pore free electrodeposited layers.

Thermal interface materials and thermal interconnect materials and layers, as described herein, may comprise metal and/or metal-based materials manufactured by Honeywell International Inc., such as nickel, copper, aluminum, silicon, carbon and combinations thereof, such as AlSiC, which are classified as heat spreaders, i.e., materials that work to dissipate heat. Thermal interconnect materials and layers may also comprise metals, metal alloys and suitable composite materials that meet at least one of the following design goals:

Can be laid down in a thin or ultra thin layer or pattern;
Can conduct thermal energy better than conventional thermal adhesives;
Has a relatively high deposition rate;
Can be deposited on a surface or other layer without having pores develop in the deposited layer; and
Can control migration of the underlying layer of material.

These thermal interface materials, thermal interconnect materials, components and products comprising these materials may advantageously be pre-attached/pre-assembled thermal solutions and/or IC (interconnect) packages.

A method of forming contemplated layered thermal interface materials and thermal transfer materials comprises: a) providing a heat spreader component, wherein the heat spreader component comprises a top surface, a bottom surface and at least one heat spreader material; b) providing at least one solder material, wherein the solder material is directly deposited onto the bottom surface of the heat spreader component; and c) depositing the at least one solder material onto the bottom surface of the heat spreader component. At least one additional layer, including a substrate layer, a surface, an adhesive, a compliant fibrous component or any other suitable layer or a thermal interface material, can be coupled to the layered thermal interface material and/or the thermal transfer material.

As mentioned, thermal interconnect materials, thermally conductive interconnect systems and layers may comprise metals, metal alloys and suitable composite materials that meet at least one of the following design goals: a) can be laid down in a thin or ultra thin layer or pattern, b) can conduct thermal energy better than conventional thermal adhesives, c) has a relatively high deposition rate, d) can be deposited on a surface or other layer without having pores develop in the deposited layer, and e) can control migration of the underlying layer of material.

Thermal interconnect materials and layers that are suitable for use are able to be laid down in a thin or ultra thin layer or pattern. The pattern may be produced by the use of a mask or the pattern may be produced by a device capable of laying down a desired pattern. Contemplated patterns include any arrangement of points or dots, whether isolated or combined to form lines, filled-in spaces and so forth. Thus, contemplated patterns include straight and curved lines, intersections of lines, lines with widened or narrowed areas, ribbons, overlapping lines. Contemplated thin layers and ultra thin layers of thermal interconnect materials (line thickness and/or plating thickness) may range from less than about 1 μm down to at least one Angstrom or even down to the size of a single atomic layer of material.

Contemplated solder materials are selected in order to provide the desired melting point and thermal transfer characteristics. Contemplated solders are selected to melt in the temperature range of about 40° C. to about 250° C. In some contemplated embodiments, the solder materials comprise a pure metal, such as indium, tin, lead, silver, copper, antimony, tellurium, bismuth, or an alloy comprising at least one of the previously mentioned metals. As used herein, the term "metal" means those elements that are in the d-block and f-block of the Periodic Chart of the Elements, along with those elements that have metal-like properties, such as silicon and germanium. As used herein, the phrase "d-block" means those elements that have electrons filling the 3d, 4d, 5d, and 6d orbitals surrounding the nucleus of the element. As used herein, the phrase "f-block" means those elements that have electrons filling the 4f and 5f orbitals surrounding the nucleus of the element, including the lanthanides and the actinides. Preferred metals include indium, silver, copper, aluminum, tin, bismuth, gallium and alloys thereof, silver coated copper, and silver coated aluminum. The term "metal" also includes alloys, metal/metal composites, metal ceramic composites, metal polymer composites, as well as other metal composites.

In some contemplated embodiments, pure indium is selected as the solder material, since it has a melting point of 156° C. In these embodiments, indium can be readily electrodeposited from electrolytes containing indium cyanide, indium fluorobate, indium sulfamate and/or indium sulfate. Once the indium is plated onto the heat spreader, one or more layers of a material, such as a noble metal and/or a low temperature silicide former—such as silver, platinum or palladium—may cover the indium layer in order to control indium oxidation when exposed to air. Platinum and palladium are good choices for this layer material, because they are low temperature silicide formers. Mixed silicides that have a lower formation temperature may also be used in these embodiments, including palladium silicide. The layer of material is understood to be a "flash layer" on top of the bulk indium plating layer, and at least one of these "flash layers" can be coupled to the plating layer. The layer of material can also be coupled to the silicon when the solder material is reflowed, in order to act as an oxide barrier and to promote bonding at the silicon surface.

As mentioned earlier, other contemplated solder materials comprise alloys that are plated onto the heat spreader. The alloy materials used in these contemplated embodiments may be dilute alloys and/or those alloys that are silicide formers, such as palladium, platinum, copper, cobalt, chromium, iron, magnesium, manganese, nickel and in some embodiments, calcium. Contemplated concentrations of these alloys would be about 100 ppm to about 5% of the alloy.

In other contemplated embodiments, the alloy includes an element, material, compound or composition that improves the wettability of the alloy to the heat spreader. Suitable elements that improve wettability are gold, calcium, cobalt, chromium, copper, iron, manganese, magnesium, molybdenum, nickel, phosphorus, palladium, platinum, tin, tantalum, titanium, vanadium, tungsten, zinc, and/or zirconium.

Once the thermal interconnect layer is deposited it is understood that it will have a relatively high thermal conductivity as compared to conventional thermal adhesives and other thermal layers. Additional layers, such as a metallized silicon die can be soldered directly to the thermal interconnect layer without the use of such damaging materials as corrosive fluxes that may be needed to remove oxides of the materials, such as nickel, used to produce the thermal spreader.

Heat spreader components or heat spreading components (heat spreader and heat spreading are used herein interchangeably and have the same common meaning) generally comprise a metal or metal-based base material, such as nickel, aluminum, copper, or AlSiC. Any suitable metal, metal-based base material or thermally conductive non-metal can be used herein as a heat spreader, as long as the metal or metal-based base material can transfer some or all of the heat generated by the electronic component.

Heat spreader components can be laid down in any suitable thickness, depending on the needs of the electronic component, the vendor and as long as the heat spreader component is able to sufficiently perform the task of dissipating some or all of the heat generated from the surrounding electronic component. Contemplated thicknesses comprise thicknesses in the range of about 0.25 mm to about 6 mm. Especially preferred thicknesses of heat spreader components are within the range of about 1 mm to about 5 mm.

The layered interface material and/or interconnect material may then be applied to a substrate, another surface, or another layered material. Substrates contemplated herein may comprise any desirable substantially solid material. Particularly desirable substrate layers would comprise films, glass, ceramic, plastic, metal or coated metal, or composite material. In preferred embodiments, the substrate comprises a silicon or germanium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and it's oxides), a polymer-based packaging or board interface such as found in a polyimide-based flex package, lead or other metal alloy solder ball surface, glass and polymers such as polymimide. The "substrate" may even be defined as another polymer material when considering cohesive interfaces. In more preferred embodiments, the substrate comprises a material common in the packaging and circuit board industries such as silicon, copper, glass, and another polymer.

Additional layers of material may be coupled to the layered interface materials in order to continue building a layered component. It is contemplated that the additional layers will comprise materials similar to those already described herein, including metals, metal alloys, composite materials, polymers, monomers, organic compounds, inorganic compounds, organometallic compounds, resins, adhesives and optical wave-guide materials.

A layer of laminating material or cladding material can be coupled to the layered interface materials depending on the specifications required by the component. Laminates are generally considered fiber-reinforced resin dielectric materials. Cladding materials are a subset of laminates that are produced when metals and other materials, such as copper, are incorporated into the laminates. (Harper, Charles A., *Electronic Packaging and Interconnection Handbook*, Second Edition, McGraw-Hill (New York), 1997.)

Spin-on layers and materials may also be added to the layered interface materials or subsequent layers. Spin-on stacked films are taught by Michael E. Thomas, "Spin-On Stacked Films for Low $k_{eff}$ Dielectrics", *Solid State Technology* (July 2001), incorporated herein in its entirety by reference. Spin-on layers and materials are also contemplated to be those materials found in PCT Application No.: PCT/US02/11927 and U.S. patent application Ser. No. 10/466,652, which are both commonly-owned by Honeywell International Inc. and are incorporated by reference herein in their entirety.

Applications of the contemplated thermal solutions, integrated circuit packages, thermal interface components, layered interface materials and heat spreader components described herein comprise incorporating the materials and/or components into another layered material, an electronic component or a finished electronic product. Electronic components, as contemplated herein, are generally thought to comprise any layered component that can be utilized in an electronic-based product. Contemplated electronic components comprise circuit boards, chip packaging, separator sheets, dielectric components of circuit boards, printed-wiring boards, and other components of circuit boards, such as capacitors, inductors, and resistors.

Electronic-based products can be "finished" in the sense that they are ready to be used in industry or by other consumers. Examples of finished consumer products are a television, a computer, a cell phone, a pager, a palm-type organizer, a portable radio, a car stereo, and a remote control. Also contemplated are "intermediate" products such as circuit boards, chip packaging, and keyboards that are potentially utilized in finished products.

Electronic products may also comprise a prototype component, at any stage of development from conceptual model to final scale-up/mock-up. A prototype may or may not contain all of the actual components intended in a finished product, and a prototype may have some components that are constructed out of composite material in order to negate their initial effects on other components while being initially tested.

EXAMPLES

In examples where the solder material is electroplated onto a surface, conventional and commercially available electroplating equipment may be used. Normally, this equipment utilizes a compliant mask to isolate the area to be plated; however, photoresists and other masking technologies work equally well.

Example 1

In this example, a nickel-plated copper heat spreader is shielded using a silicone rubber mask. The area contained within the mask is electrodeposited with a solder or solder component of an appropriate and predetermined thickness, depending on the needs of the component, finished product, customer and/or vendor. The film thickness can be enough to pre-wet the surface (and the bulk solder provided by other methods) or the entire solder film thickness can be electrodeposited. The decision on the thickness of the film can also be based on the quality of the completed part (and the resulting yield) and the economics of the metal deposition.

Example 2

In one example, the heat spreader is masked and a film of electrodeposited solder is built to a thickness of about 25 to about 150 micrometers in one continuous step. Equipment to achieve this continuous application is commercially available from suppliers, such as ALF and EEJA in Japan and SFT in the United States. A layer of plating material (such as a noble metal or a silicide former) may be added to the top of this layered material. In some examples, the plating material comprises palladium.

Example 3

In another example, the electrodeposited film is limited to a film thickness of about 25 micrometers or less. In this example, a second step to build the total solder thickness to about 25 to about 150 micrometers would be required. The second step may comprise silk screening, direct attachment of a preform or jetting of solder powders or liquid.

Example 4

One example of a contemplated method comprises:
1. Forming a copper heat spreader;
2. Electroplating at least part of the copper part with nickel or a similar solderable material;
3. Electrodepositing a film of solder material or at least one component of a solder system thereby forming a eutectic; and
4. Optionally building the solder thickness to an appropriate thickness by silk screening, direct attachment of a preform or jetting of solder powders or liquid.

In the case where the materials are plated with a thin film of solder and the bulk of the solder is provided in paste form, the yields will be improved because of pre-wetting of the nickel plate by the solder paste.

Example 5

In yet another example, metals are selected such that the plated film and the dispensed film form the solder. For example, a film of tin is electroplated and used with a lead paste to form a tin-lead solder of an appropriate and suitable ratio.

Thus, specific embodiments and applications of thermal solutions, IC packaging, thermal interconnect and interface materials have been disclosed. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

We claim:

1. A thermal transfer material, comprising:
a heat spreader component, wherein the heat spreader component comprises a top surface, a bottom surface and at least one heat spreader material and wherein the heat spreader component comprises a thickness of about 0.25 mm to about 6 mm, and
at least one solder material, wherein the solder material is directly deposited onto the bottom surface of the heat spreader component.

2. The thermal transfer material of claim 1, wherein the solder material is further coupled to a substrate.

3. The thermal transfer material of claim 2, wherein the substrate comprises silicon.

4. The thermal transfer material of claim 3, wherein the substrate is a metalized silicon die.

5. The thermal transfer material of claim 1, wherein the heat spreader component comprises a metal, metal-based material or combination thereof.

6. The thermal transfer material of claim 5, wherein the heat spreader component comprises nickel, aluminum, copper or a combination thereof.

7. The thermal transfer material of claim 5, wherein the metal-based material comprises silicon, carbon or a combination thereof.

8. The thermal transfer material of claim 1, wherein the thickness is from about 1 mm to about 5 mm.

9. The thermal transfer material of claim 1, wherein the at least one solder material comprises a metal, a metal-based material or a combination thereof.

10. The thermal transfer material of claim 9, wherein the metal comprises a transition metal.

11. The thermal transfer material of claim 10, wherein the metal comprises indium, tin, lead, silver, copper, antimony, tellurium or bismuth.

12. The thermal transfer material of claim 10, wherein the metal-based material comprises an alloy.

13. The thermal transfer material of claim 12, wherein the alloy comprises indium, tin, lead, silver, copper, antimony, tellurium, bismuth or a combination thereof.

14. The thermal transfer material of one of claims 11 or 12, further comprising a layer of a noble metal or a silicide former.

15. The thermal transfer material of claim 14, wherein the silicide former comprises silver, platinum or palladium.

16. The thermal transfer material of claim 15, wherein the silicide former is a flash layer.

17. The thermal transfer material of claim 1, wherein the solder material is directly deposited using electrodeposition.

18. A method of forming a thermal transfer material, comprising:
providing a heat spreader component, wherein the heat spreader component comprises a top surface, a bottom surface and at least one heat spreader material and wherein the heat spreader component comprises a thickness of about 0.25 mm to about 6 mm;
providing at least one solder material, wherein the solder material is directly deposited onto the bottom surface of the heat spreader component; and
depositing the at least one solder material onto the bottom surface of the heat spreader component.

19. The method of claim 18, wherein the solder material is further coupled to a substrate.

20. The method of claim 19, wherein the substrate comprises silicon.

21. The method of claim 20, wherein the substrate is a metalized silicon die.

22. The method of claim 18, wherein the heat spreader component comprises a metal, metal-based material or combination thereof.

23. The method of claim 22, wherein the heat spreader component comprises nickel, aluminum, copper or a combination thereof.

24. The method of claim 22, wherein the metal-based material comprises silicon, carbon or a combination thereof.

25. The method of claim 18, wherein the thickness is from about 1 mm to about 5 mm.

26. The method of claim 18, wherein the at least one solder material comprises a metal, a metal-based material or a combination thereof.

27. The method of claim 26, wherein the metal comprises a transition metal.

28. The method of claim 27, wherein the metal comprises indium, tin, lead, silver, copper, antimony, tellurium or bismuth.

29. The method of claim 27, wherein the metal-based material comprises an alloy.

30. The method of claim 29, wherein the alloy comprises indium, tin, lead, silver, copper, antimony, tellurium, bismuth or a combination thereof.

31. The method of one of claims 28 or 29, further comprising a layer of a noble metal or a silicide former.

32. The method of claim 31, wherein the silicide former comprises silver, platinum or palladium.

33. The method of claim 32, wherein the silicide former produces a flash layer.

34. The method of claim 18, wherein the solder material is directly deposited using electrodeposition.

* * * * *